(12) United States Patent
Cheng et al.

(10) Patent No.: US 9,269,575 B2
(45) Date of Patent: Feb. 23, 2016

(54) TRENCH SIDEWALL PROTECTION FOR SELECTIVE EPITAXIAL SEMICONDUCTOR MATERIAL FORMATION

(71) Applicant: International Business Machines Corporation, Armonk, NY (US)

(72) Inventors: Kangguo Cheng, Schenectady, NY (US); Bruce B. Doris, Brewster, NY (US); Hong He, Schenectady, NY (US); Ali Khakifirooz, Mountain View, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 153 days.

(21) Appl. No.: 14/042,889

(22) Filed: Oct. 1, 2013

(65) Prior Publication Data

US 2015/0061077 A1 Mar. 5, 2015

Related U.S. Application Data

(63) Continuation of application No. 14/017,443, filed on Sep. 4, 2013.

(51) Int. Cl.
*H01L 27/088* (2006.01)
*H01L 29/78* (2006.01)
*H01L 29/66* (2006.01)
*H01L 21/02* (2006.01)

(52) U.S. Cl.
CPC .... *H01L 21/02647* (2013.01); *H01L 21/02041* (2013.01); *H01L 21/02488* (2013.01); *H01L 29/66795* (2013.01); *H01L 29/785* (2013.01); *H01L 21/0262* (2013.01); *H01L 21/02532* (2013.01); *H01L 21/02639* (2013.01)

(58) Field of Classification Search
None
See application file for complete search history.

(56) References Cited

U.S. PATENT DOCUMENTS

| | | | |
|---|---|---|---|
| 6,051,509 | A | 4/2000 | Tsuchiaki |
| 6,806,154 | B1 | 10/2004 | Lo |
| 6,855,583 | B1 | 2/2005 | Krivokapic et al. |
| 7,049,662 | B2 | 5/2006 | Natzle et al. |
| 7,176,109 | B2 | 2/2007 | Ping et al. |
| 7,176,110 | B2 | 2/2007 | van Bentum et al. |

(Continued)

FOREIGN PATENT DOCUMENTS

| CN | 101140887 A | 3/2008 |
|---|---|---|
| CN | 102222693 A | 10/2011 |

(Continued)

OTHER PUBLICATIONS

English translation of CN 102446760.*

(Continued)

*Primary Examiner* — Pamela E Perkins
(74) *Attorney, Agent, or Firm* — Cantor Colburn LLP

(57) ABSTRACT

A method of forming a semiconductor device includes forming an insulator layer over a substrate; opening a trench in the insulator layer so as to expose one or more semiconductor structures formed on the substrate; forming a protective layer on sidewalls of the trench; subjecting the substrate to a precleaning operation in preparation for epitaxial semiconductor formation, wherein the protective layer prevents expansion of the sidewalls of the trench as a result of the precleaning operation; and forming epitaxial semiconductor material within the trench and over the exposed one or more semiconductor structures.

6 Claims, 10 Drawing Sheets

(56) References Cited

U.S. PATENT DOCUMENTS

| | | |
|---|---|---|
| 7,355,233 B2 | 4/2008 | Liaw |
| 7,405,968 B2 | 7/2008 | Mokhlesi et al. |
| 7,420,230 B2 | 9/2008 | Tsuchiaki |
| 7,550,343 B2 | 6/2009 | Wasshuber |
| 7,572,715 B2 | 8/2009 | Kim et al. |
| 7,592,619 B2 | 9/2009 | Tsai et al. |
| 7,736,982 B2 | 6/2010 | Liao et al. |
| 8,012,840 B2 | 9/2011 | Ando |
| 8,022,488 B2 | 9/2011 | Cheng et al. |
| 8,030,708 B2 | 10/2011 | Tateshita |
| 8,138,543 B2 | 3/2012 | Cheng et al. |
| 2002/0001891 A1 | 1/2002 | Kim et al. |
| 2006/0175667 A1* | 8/2006 | Tsuchiaki ................. 257/391 |
| 2007/0090466 A1 | 4/2007 | Park et al. |
| 2008/0261361 A1 | 10/2008 | Loiko et al. |
| 2010/0084713 A1 | 4/2010 | Nakagawa et al. |
| 2010/0249445 A1 | 9/2010 | Yan et al. |
| 2011/0201164 A1 | 8/2011 | Chung et al. |
| 2012/0126433 A1 | 5/2012 | Montanya Silvestre |
| 2013/0134506 A1* | 5/2013 | Yagishita ................. 257/330 |
| 2013/0249006 A1 | 9/2013 | Khakifirooz et al. |
| 2014/0170825 A1* | 6/2014 | He et al. ................. 438/283 |
| 2015/0048516 A1* | 2/2015 | Lu et al. ................. 257/774 |

FOREIGN PATENT DOCUMENTS

| | | |
|---|---|---|
| CN | 102446760 A | 5/2012 |
| CN | 102956496 A | 3/2013 |

OTHER PUBLICATIONS

PCT International Search Report and Written Opinion; International Application No. PCT/CN2014/084794; International Filing Date: Aug. 20, 2014; Date of Mailing: Nov. 19, 2014, pp. 1-12.

* cited by examiner

TRENCH SIDEWALL PROTECTION FOR SELECTIVE EPITAXIAL SEMICONDUCTOR MATERIAL FORMATION

CROSS-REFERENCE TO RELATED APPLICATION

This application is a continuation of U.S. patent application Ser. No. 14/017,443, filed Sep. 4, 2013, the disclosure of which is incorporated by reference herein in its entirety.

BACKGROUND

The present invention relates generally to semiconductor device manufacturing techniques and, more particularly, to trench sidewall protection for selective epitaxial semiconductor material formation.

In the manufacture of integrated circuit devices such as field effect transistors (FETs) it is sometimes desirable to selectively add semiconductor material to an existing, pre-formed semiconductor structure prior continuing with subsequent processing steps. For example, in planar transistor configurations, a raised source/drain region is a semiconductor region that is formed on a pre-existing semiconductor region of an FET and functions as a part of the source/drain region of the field effect transistor. A raised source/drain region can be formed on a pre-existing source/drain region by a selective deposition process, which selectively deposits additional semiconductor material on exposed semiconductor surfaces without depositing any semiconductor material on dielectric surfaces.

In another example, non-planar FETs incorporate various vertical transistor structures, and typically include two or more gate structures formed in parallel. One such semiconductor structure is known as the finFET, which takes its name from the multiple thin silicon "fins" that are used to form the respective gate channels, and which are typically on the order of tens of nanometers in width. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device generally has faster switching times, equivalent or higher current density, and much improved short channel control than planar CMOS technology utilizing similar critical dimensions.

In certain instances, it is desirable to selectively merge selected regions of predefined fin structures, such as through selective epitaxial growth of a semiconductor material.

Regardless of whether a device is a planar transistor or a finFET, it is desirable to be able to precisely control where such additional regions of semiconductor materials are formed.

SUMMARY

In an exemplary embodiment, a method of forming a semiconductor device includes forming an insulator layer over a substrate; opening a trench in the insulator layer so as to expose one or more semiconductor structures formed on the substrate; forming a protective layer on sidewalls of the trench; subjecting the substrate to a precleaning operation in preparation for epitaxial semiconductor formation, wherein the protective layer prevents expansion of the sidewalls of the trench as a result of the precleaning operation; and forming epitaxial semiconductor material within the trench and over the exposed one or more semiconductor structures.

In another embodiment, a method of forming a semiconductor device includes forming a plurality of semiconductor fins over a substrate; forming an insulator layer over the semiconductor fins and the substrate; opening a trench in the insulator layer so as to expose a selected region of the plurality of semiconductor fins; forming a protective layer on sidewalls of the trench; subjecting the substrate to a precleaning operation in preparation for epitaxial semiconductor formation, wherein the protective layer prevents expansion of the sidewalls of the trench as a result of the precleaning operation; and forming epitaxial semiconductor material within the trench and over the exposed plurality of semiconductor fins so as to merge the semiconductor fins.

In another embodiment, a semiconductor device includes a plurality of semiconductor structures formed on a substrate; an insulator layer formed over a substrate; a trench formed in the insulator layer, the trench configured to expose a portion of the plurality of semiconductor structures; a protective layer formed on sidewalls of the trench, the protective layer comprising a material that prevents expansion of the sidewalls of the trench as a result of a precleaning operation; and an epitaxial semiconductor material formed within the trench and over the exposed one or more semiconductor structures.

BRIEF DESCRIPTION OF THE SEVERAL VIEWS OF THE DRAWINGS

Referring to the exemplary drawings wherein like elements are numbered alike in the several Figures:

FIGS. 1 through 9 are a series of cross sectional views illustrating a method of protecting patterned trenches in a dielectric layer in preparation for additional semiconductor material formation, in which:

FIG. 1 illustrates a starting semiconductor-on-insulator (SOI) substrate including a bulk layer, a buried insulator (BOX) layer and a thin SOI layer, with the SOI layer patterned into fin structures;

FIG. 2 illustrates the formation of a dielectric layer over the structure of FIG. 1;

FIG. 3 illustrates the formation of a trench in a region of the dielectric layer of FIG. 2;

FIG. 4 illustrates the formation of a protective guard layer over surfaces of the dielectric layer, including the trench, exposed fin structures, and exposed BOX layer;

FIG. 5 illustrates a directional etch of the protective guard layer to a point at which horizontal portions of the guard layer are removed;

FIG. 6 illustrates a continuation of the directional etch such that vertical portions of the guard layer on the exposed fin structures are removed, leaving vertical portions only on lower sidewall portions of the trench, and thereby defining a trench guard ring;

FIG. 7 illustrates a precleaning operation of the structure of FIG. 6, resulting in erosion of upper sidewall portions of the trench where the guard layer was removed;

FIG. 8 illustrates a semiconductor epitaxial growth process resulting in merging of the exposed fin structures;

FIG. 9 illustrates silicide layer formation over the exposed semiconductor material in the trench.

DETAILED DESCRIPTION

With respect to selective formation of additional semiconductor material over existing, preformed semiconductor structures as described above, one approach is to selectively pattern trenches or openings in a substrate level dielectric layer that covers the preformed semiconductor structures. Once the trenches are opened, an additive semiconductor formation process is performed (e.g., epitaxial growth) so that the epitaxial semiconductor material is formed only on exposed semiconductor regions as exposed by the trenches in the dielectric layer.

However, one problem with this approach is the result of a hydrofluoric acid (HF) precleaning operation used in conjunction with a dielectric layer such as $SiO_2$. The use of such a cleaning solution may undesirably attack the patterned dielectric layer and enlarge the area of the openings beyond a desired tolerance. This in turn may lead to the formation (growth) of additional semiconductor material in regions that are not desired.

Accordingly, disclosed herein is a protection scheme for preserving the integrity of patterned trenches in a dielectric layer in preparation for additional semiconductor material formation. As described in further detail below, the present embodiments address this issue by introducing an etch resistant guard material that preserves trench sidewall integrity during a precleaning operation such as an HF etch. The guard material prevents excessive erosion of the trench sidewalls so as to prevent undesired semiconductor material formation (e.g., fin merging where not desired). As will be appreciated, the embodiments described herein are applicable to both planar and finFET device structures.

Referring generally now to FIGS. 1 through 9, there are shown a series of cross sectional views illustrating a method of protecting patterned trenches in a dielectric layer in preparation for additional semiconductor material formation, in accordance with an exemplary embodiment.

Figure 1:
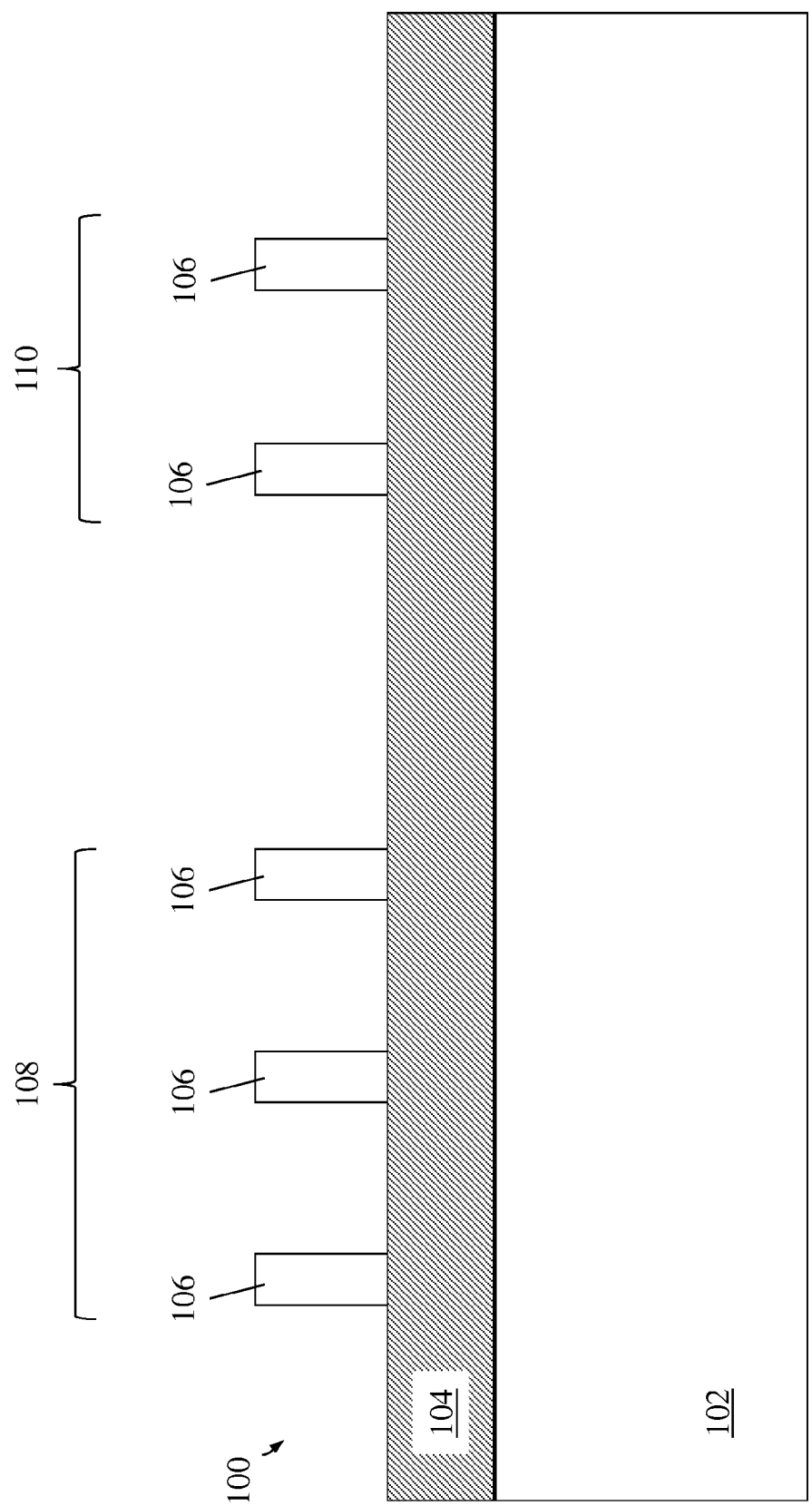

As shown in FIG. 1, a substrate 100 includes a bulk semiconductor layer 102, a buried insulator (e.g., oxide) (BOX) layer 104 formed on the bulk semiconductor layer 102, and an active SOI layer formed on the BOX layer 104. Here, the illustrated portions of the SOI layer are shown as having been patterned into patterned into fin structures 106, as known in the art of finFET processing. The semiconductor substrate material of the bulk layer 102 and/or the material SOI layer 206 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

As further shown in FIG. 1, fin structures 106 of a first group 108 are to be subsequently merged, while other fin structures 106 of a second group 110 are to remain intact. The second group 110 of the fin structures 106 is shown for illustrative purposes. Although not specifically illustrated in the cross sectional view of FIG. 1, there may be one or more gate stack structures formed over the semiconductor fin structures.

Figure 2:
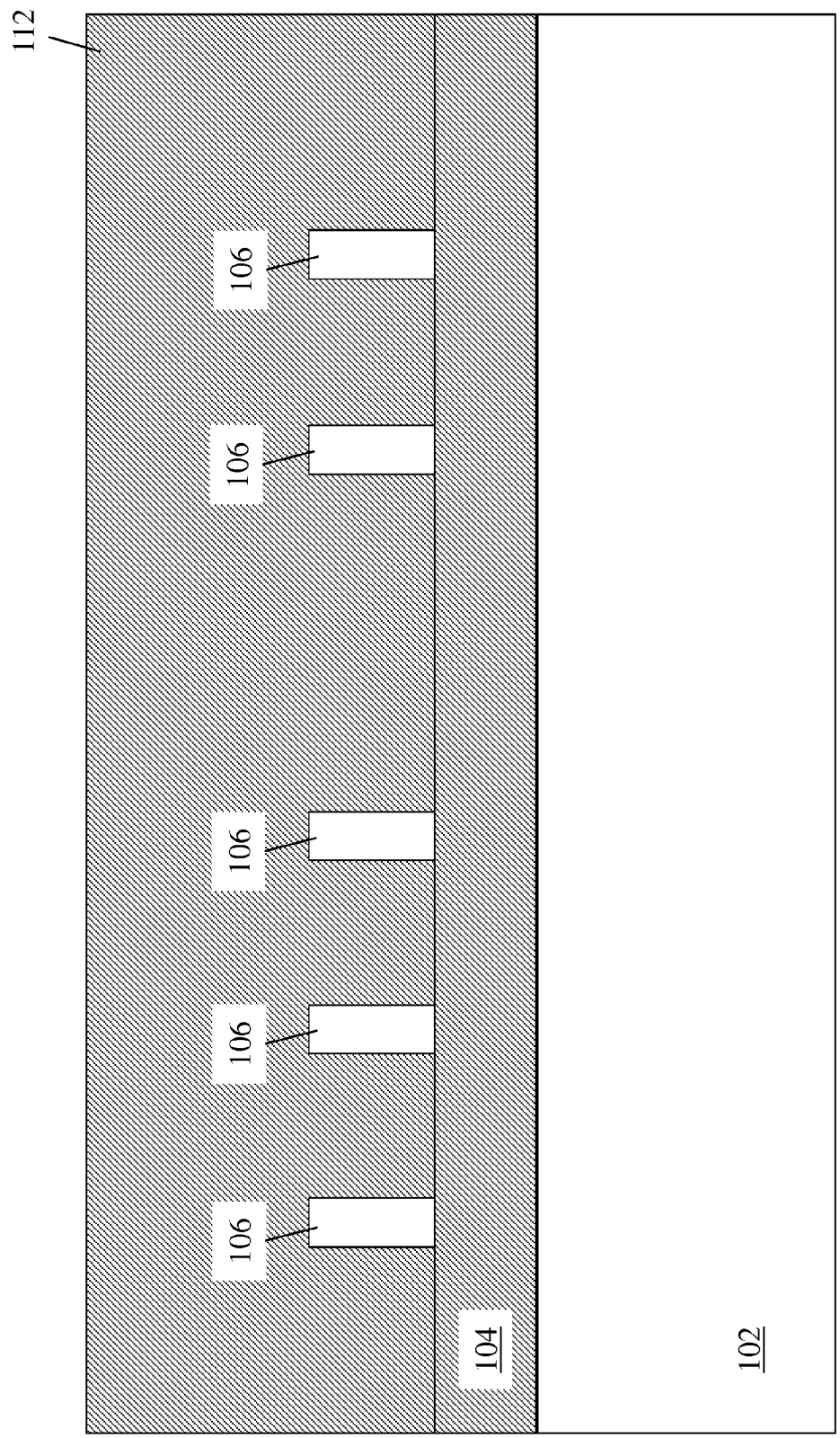

In FIG. 2, an interlevel dielectric (ILD) layer 112, such as silicon dioxide ($SiO_2$) for example, is formed over the structure of FIG. 1. More generally, the ILD layer 112 can include a dielectric material such as undoped silicon oxide, doped silicon oxide, silicon nitride, porous or non-porous organosilicate glass, porous or non-porous nitrogen-doped organosilicate glass, or a combination thereof. The ILD layer 112 can be deposited, for example, by chemical vapor deposition or spin-coating. If the top layer of the ILD layer 112 is not self-planarizing, then the top surface of the ILD layer 112 may be planarized, for example, by chemical mechanical planarization (CMP).

Figure 3:
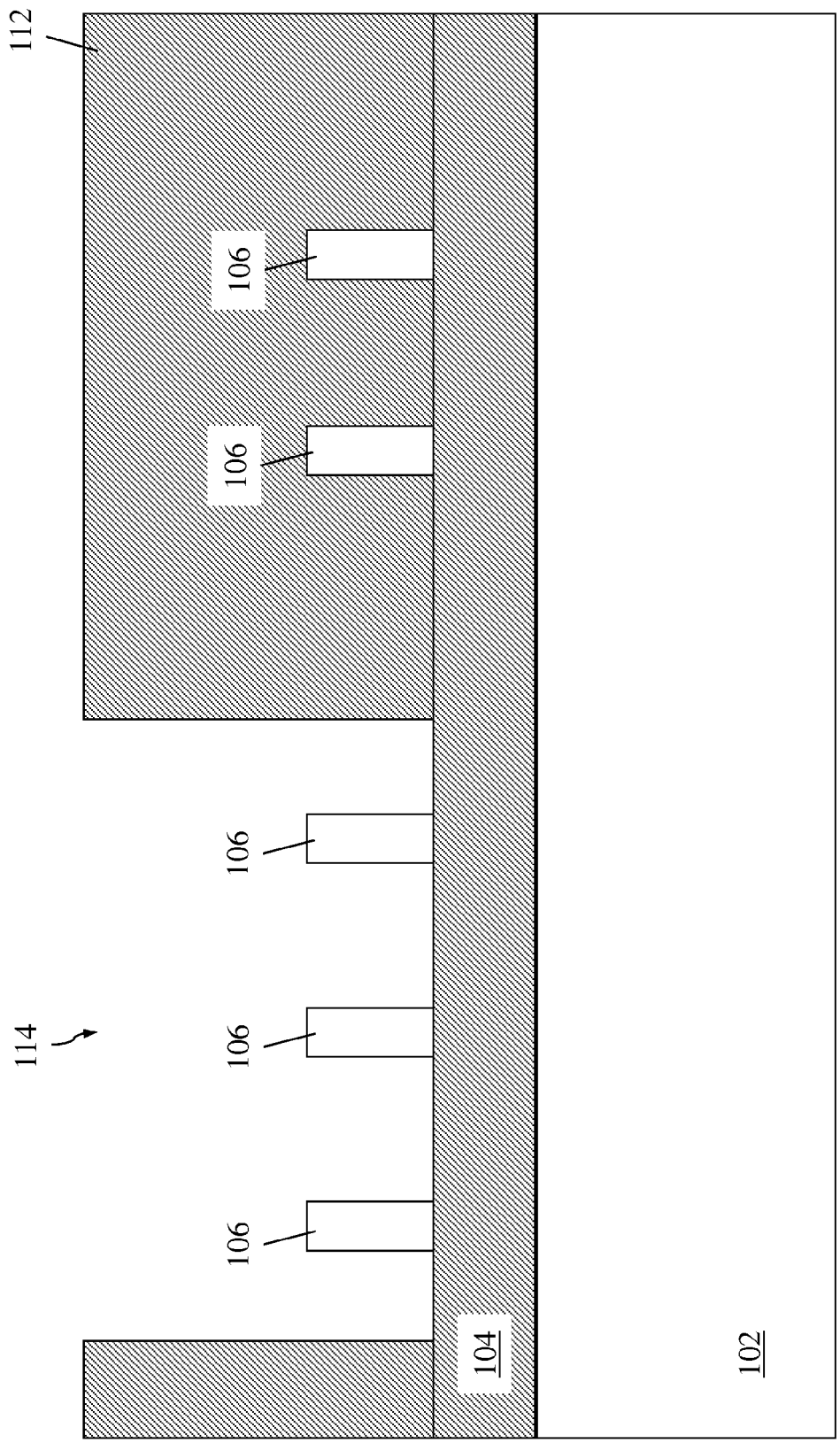

FIG. 3 illustrates the formation of a trench 114 in a region of the ILD layer 112 of FIG. 2, corresponding to the first group of fins 106 to be merged. In this regard, a photoresist layer (not shown) is applied over the ILD layer 112, and is lithographically patterned to form various openings therein. The various openings overlie a portion of the device where it is desired to merge at least some the plurality of fins 106. The pattern in the photoresist layer is then transferred through the ILD layer 112 so as to form the trench 114 shown in FIG. 3. An anisotropic etch having a chemistry that removes the dielectric material(s) of the ILD layer 112 selective to the semiconductor fin material may be employed.

Figure 4:
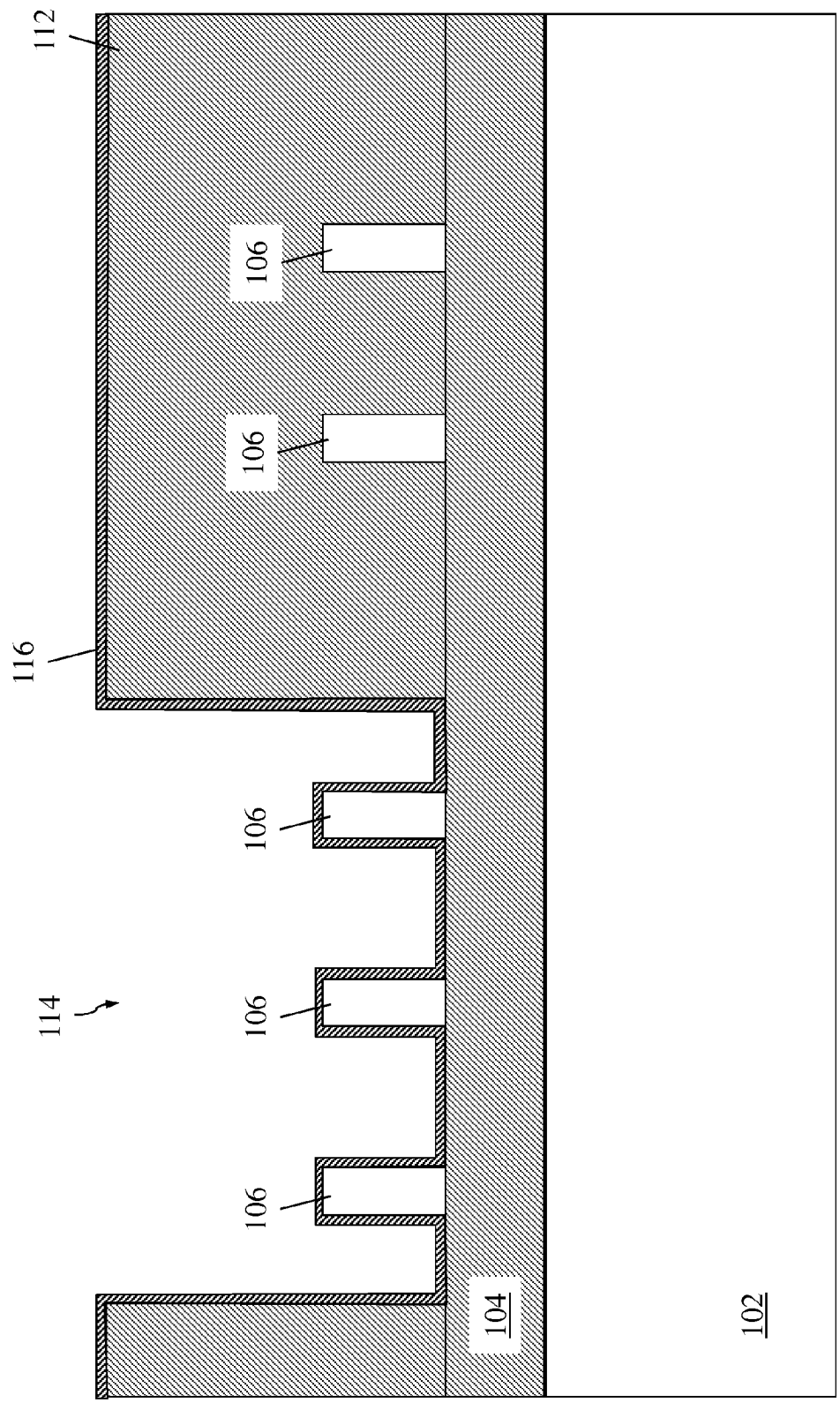

Once the trench 114 is defined, FIG. 4 illustrates the formation of a protective guard layer 116 over surfaces of the ILD layer 112, the exposed fin structures 106, and exposed BOX layer 104. The protective guard layer 116 may be any suitable layer(s) that is resistive to hydrofluoric acid (HF) exposure such as, for example, silicon nitride (SiN) or silicon oxynitride (SiON). Formation of the protective guard layer 116 may be implemented by a highly conformal process, such as by low pressure chemical vapor deposition (LPCVD) for example.

Figure 5:
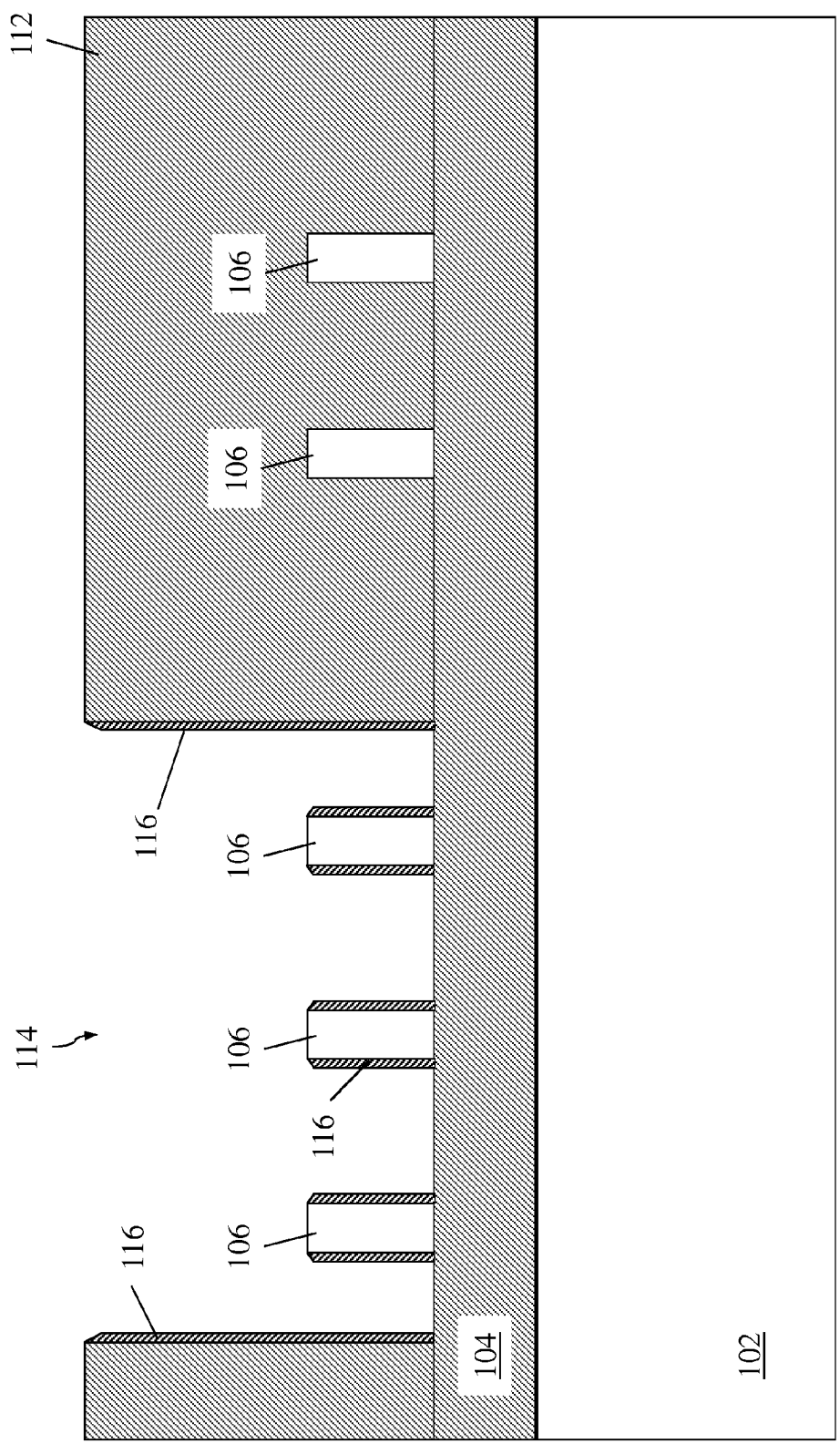
Figure 6:
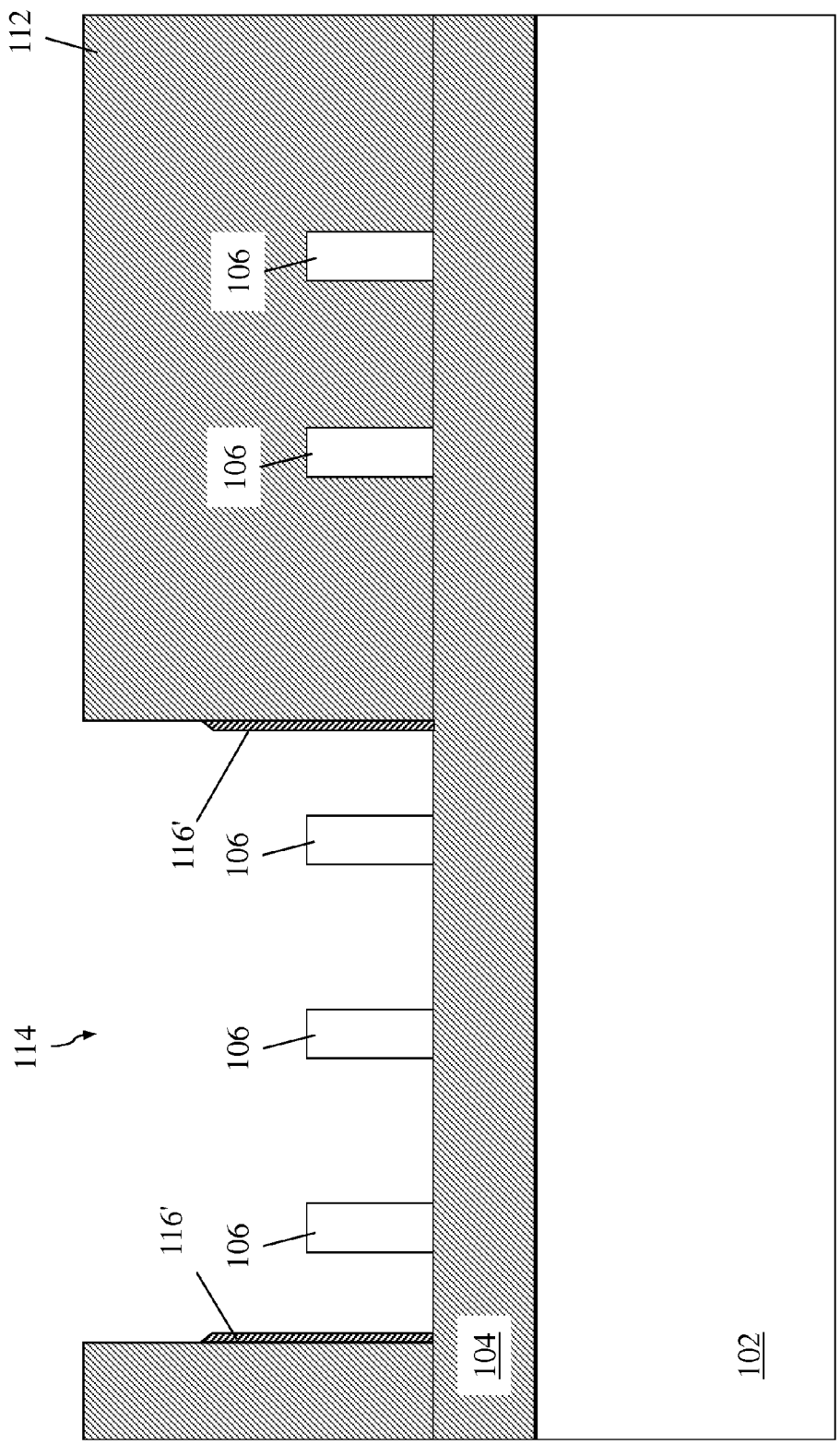

Referring next to FIG. 5, a directional etch of the protective guard layer 116 is employed to a point at which portions of the guard layer 116 are initially removed from horizontal surfaces. Then, as shown in FIG. 6, the directional etch is continued until vertical portions of the guard layer 116 on the exposed fin structures 106 are removed, leaving vertical portions of the guard layer 116 only on lower sidewall portions of the trench 114, and thereby defining a trench guard ring 116'. The height of the guard ring 116' is sufficient to protect lower sidewall portions of the trench dielectric 112 from HF erosion, thereby preventing undesired lower trench widening that could result in subsequent epitaxial semiconductor material from being deposited in areas that are not desired.

Figure 7:
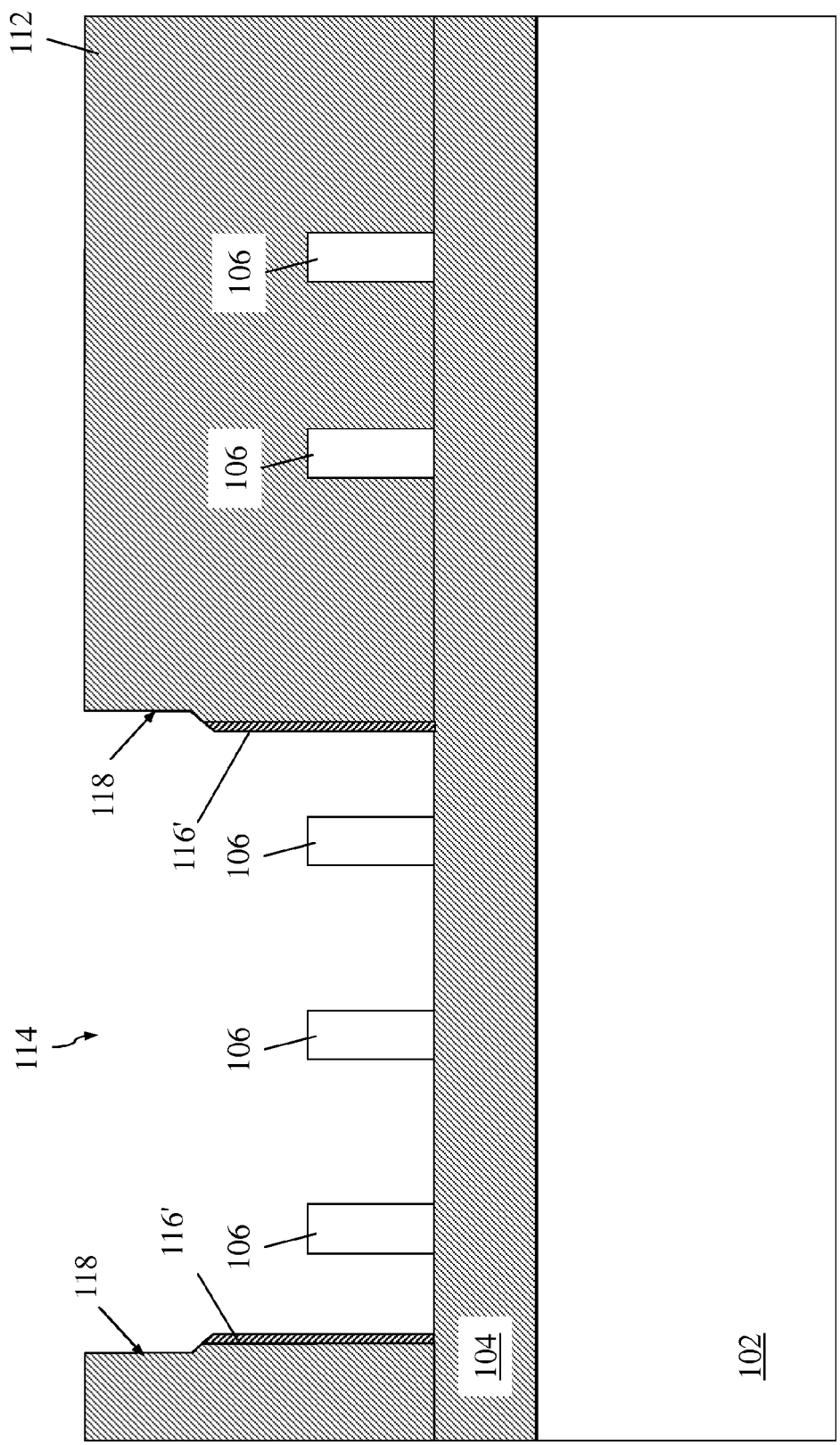
Figure 8:
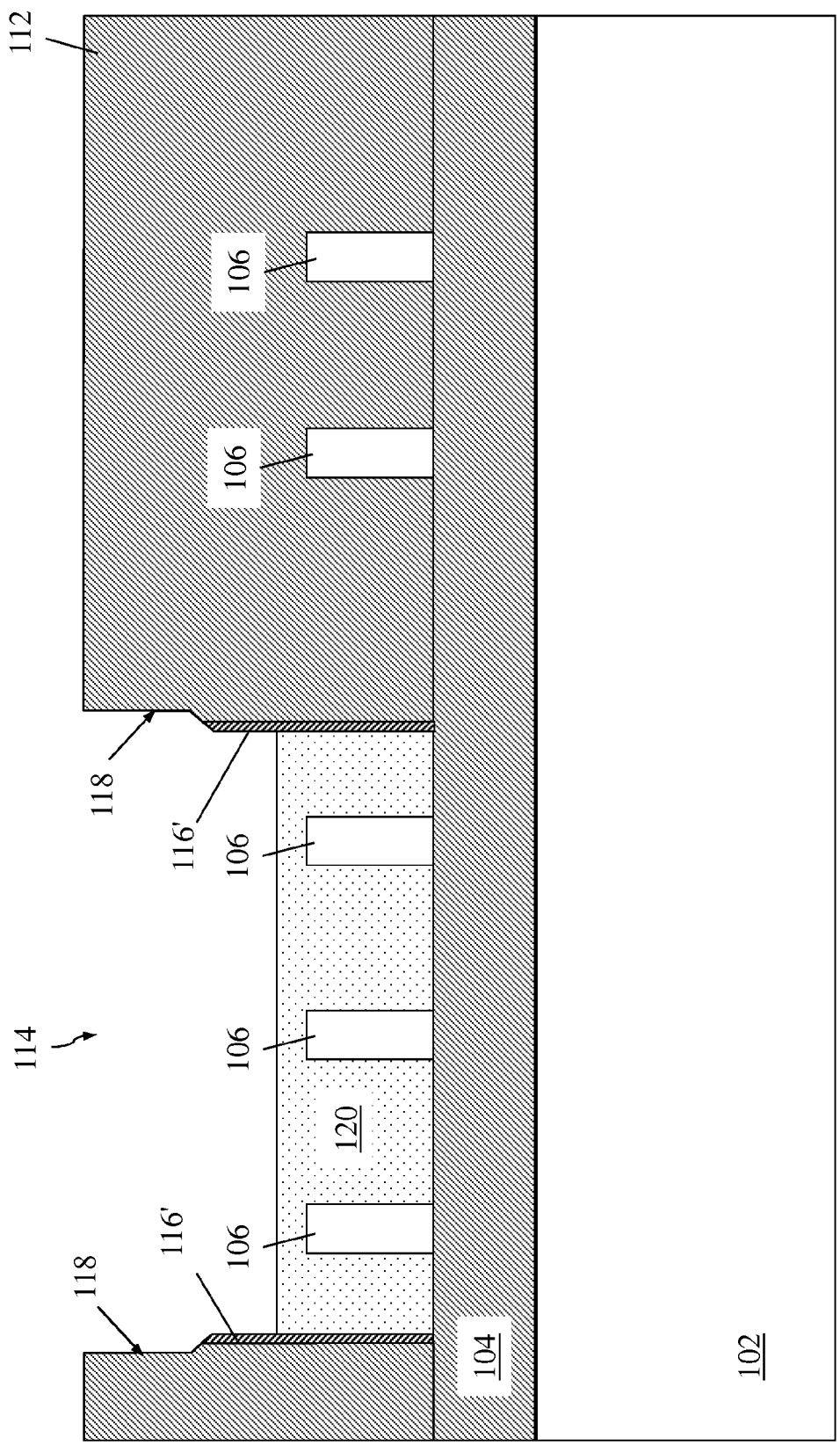

FIG. 7 illustrates an HF precleaning operation of the structure of FIG. 6 in preparation for epitaxial semiconductor material formation, resulting in the erosion of upper sidewall portions of the trench 114 where the guard layer 116 was previously removed. Such recessed (widened) regions of the upper portion of the trench are indicated at 118 in FIG. 7. Then, as shown in FIG. 8, a semiconductor epitaxial growth process is performed to result in merging of the exposed fin structures 106. That is, the formed epitaxial semiconductor material 120 within the trench 114 extends at least above a height of the semiconductor fins 106 so as to merge the semiconductor fins. The added epitaxial semiconductor material 120 be the same as, or different from the fin semiconductor material. For example, the epitaxial semiconductor material may be, for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material. In one embodiment, the epitaxial semiconductor material is single crystalline.

In contrast to relatively thin epitaxial processes (e.g., for extension formation), the trench epitaxial deposition is a relatively thick process that is not self-aligned to semiconductor surfaces. The deposition may be implemented, for example, by flowing a reactant gas including a precursor for the semiconductor material in a processing chamber in which the semiconductor structure is placed for processing. Exemplary precursors to the semiconductor material include, but are not limited to, $SiH_4$, $Si_2H_6$, $SiH_2Cl_2$, $SiHCl_3$, $SiCl_4$, $GeH_4$, $Ge_2H_6$, $GeH_2Cl_2$, and other precursor materials for compound semiconductor materials as known in the art.

Figure 9:
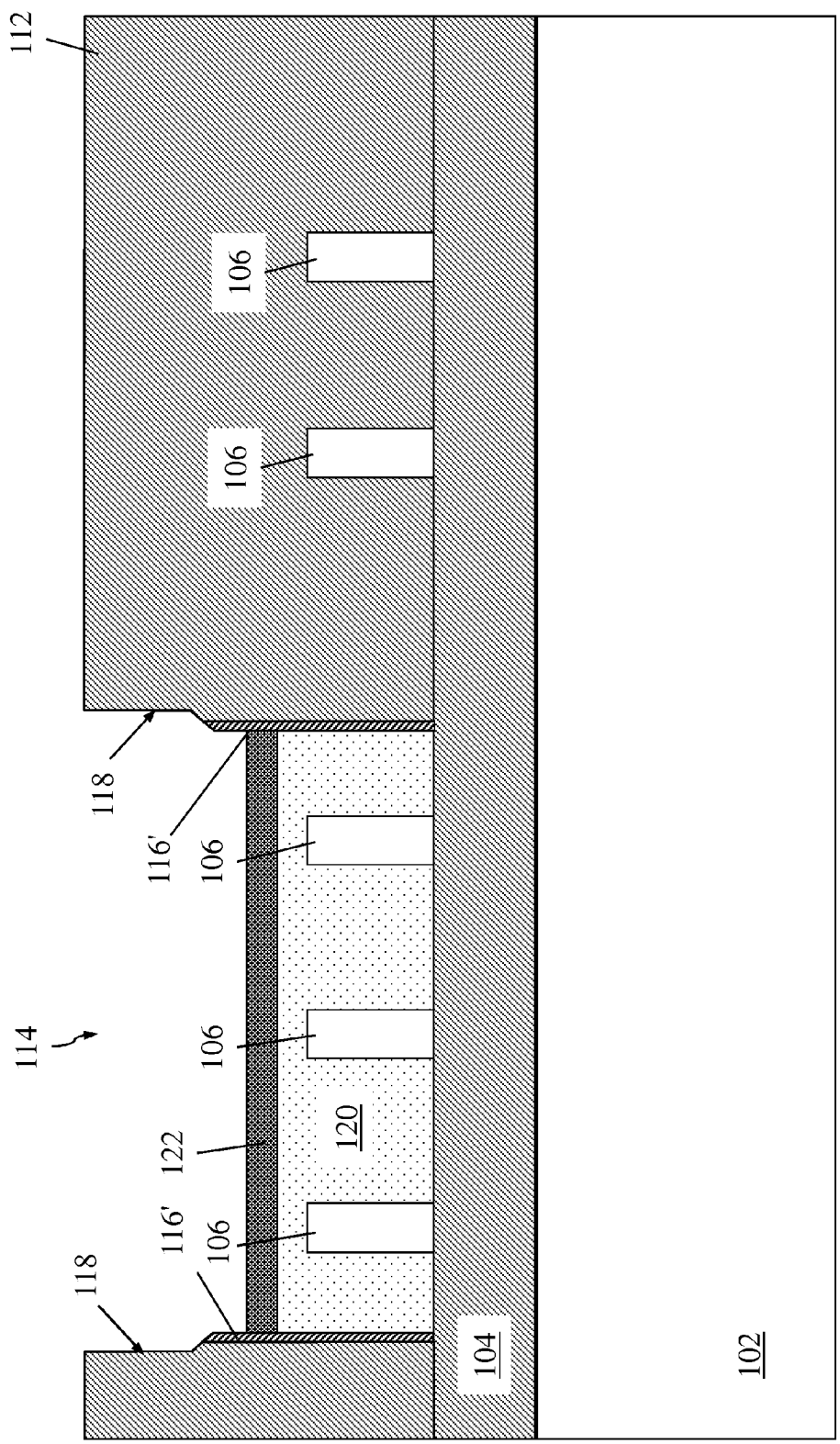
Figure 10:
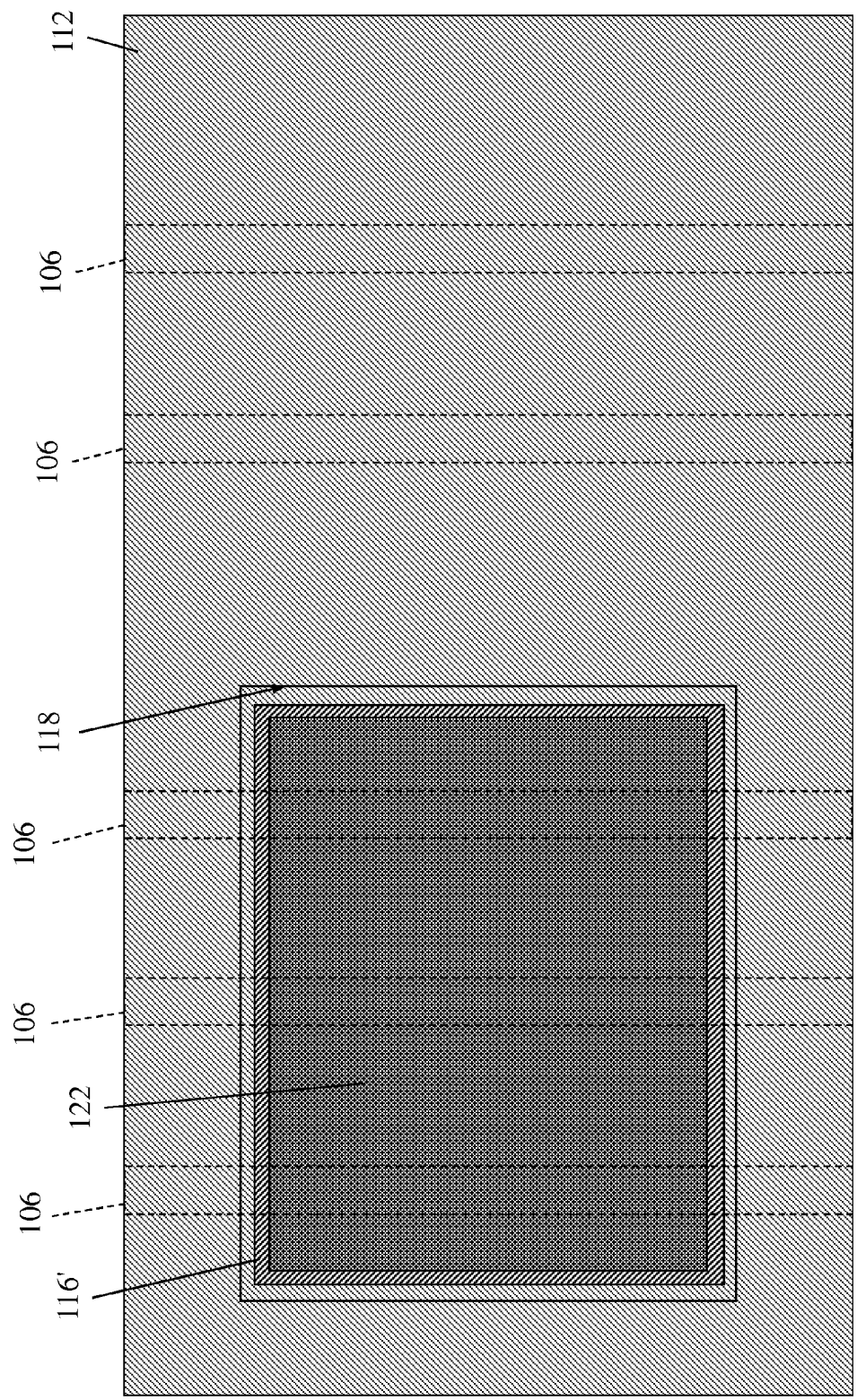
FIG. 10 is a top view of the structure depicted in FIG. 9.

It is again pointed out that as a result of the trench guard ring 116', deposition of the semiconductor material 120 is confined to the patterned trench region originally defined in FIG. 3 and not expanded as the result of an HF attack on the ILD material 112. Then, as shown in FIG. 9 and the top view of FIG. 10, a silicide layer 122 is formed over the epitaxial semiconductor material 120. The silicide layer 122 is formed by deposition of a refractory metal such as, for example, nickel (Ni), platinum (Pt), cobalt (Co), titanium (Ti), tantalum (Ta), and cobalt (Co), over the entire structure. A reaction is induced during an anneal at an elevated temperature between the metal of the temporary metal layer and the underlying semiconductor material 120 to form a metal semiconductor alloy portions (i.e., the silicide layer 122). The temperature of the anneal can be, for example, between 300° C. and 1000° C. Unreacted portions of the temporary metal layer are removed selective to the silicide layer 122, for example, by a wet etch. From this point, processing may continue as known in the art.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A semiconductor device, comprising:
   a plurality of semiconductor fins formed on a substrate;
   an oxide insulator layer formed over the substrate, the oxide insulator layer having a top surface at a height that is above a top surface of the semiconductor fins;
   a trench formed in the oxide insulator layer, the trench configured to expose a portion of the plurality of semiconductor fins;
   a protective layer formed on lower sidewalls of the trench, and in contact only with oxide material, the protective layer comprising a material that is resistant to an etchant material that etches oxide, wherein a height of the protective layer is above the top surface of the semiconductor fins, and below the top surface of the oxide insulator layer; and
   an epitaxial semiconductor material formed within the trench and over the exposed one or more semiconductor structures, wherein a height of the epitaxial semiconductor material is above the top surface of the semiconductor fins and below the height of the protective layer.

2. The device of claim 1, wherein the protective layer is selected to resist erosion by hydrofluoric acid.

3. The device of claim 2, wherein the protective layer comprises one or more of silicon nitride and silicon oxynitride.

4. The device of claim 1, wherein the formed epitaxial semiconductor material merges the semiconductor fins.

5. The device of claim 4, further comprising a silicide layer formed over the epitaxial semiconductor material and plurality of semiconductor fins, the silicide layer having a top surface below the height of the protective layer.

6. The device of claim 1, wherein upper sidewalls of the trench not having the protective layer formed thereon are widened with respect to the lower sidewalls.

\* \* \* \* \*